United States Patent
Wang

(10) Patent No.: US 12,429,084 B2
(45) Date of Patent: Sep. 30, 2025

(54) HINGE MECHANISM AND ELECTRONIC DEVICE

(71) Applicant: VIVO MOBILE COMMUNICATION CO., LTD., Dongguan (CN)

(72) Inventor: Zhiwei Wang, Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 207 days.

(21) Appl. No.: 18/344,634

(22) Filed: Jun. 29, 2023

(65) Prior Publication Data

US 2023/0340988 A1 Oct. 26, 2023

Related U.S. Application Data

(63) Continuation of application No. PCT/CN2021/142366, filed on Dec. 29, 2021.

(51) Int. Cl.
*H05H 5/00* (2006.01)
*F16C 11/04* (2006.01)
*H05K 5/02* (2006.01)

(52) U.S. Cl.
CPC ............ *F16C 11/04* (2013.01); *H05K 5/0226* (2013.01)

(58) Field of Classification Search
CPC ..... F16C 11/04; H05K 5/0226; G06F 1/1618; G06F 1/1652; G06F 1/181; G06F 1/1681; H04M 1/022; G09F 9/301
See application file for complete search history.

(56) References Cited

U.S. PATENT DOCUMENTS

| 11,194,366 | B2 * | 12/2021 | Cheng | G06F 1/1626 |
| 11,567,543 | B2 * | 1/2023 | Siddiqui | G06F 1/1679 |
| 11,579,661 | B2 * | 2/2023 | Kinoshita | G06F 1/1681 |

(Continued)

FOREIGN PATENT DOCUMENTS

| CN | 108648624 A | 10/2018 |
| CN | 110784570 A | 2/2020 |

(Continued)

OTHER PUBLICATIONS

International Search Report and Written Opinion related to Application No. PCT/CN2021/142366; reported on Mar. 17, 2022.

(Continued)

*Primary Examiner* — Rockshana D Chowdhury

(74) *Attorney, Agent, or Firm* — von Briesen & Roper, s.c.

(57) ABSTRACT

A hinge mechanism includes a hinge base and rotating support mechanisms respectively connected to two opposite sides of the hinge base. The rotating support mechanism includes a rotating shaft, a hinge rotating plate and a hinge moving plate. The hinge rotating plate is rotatably connected to the hinge base through the rotating shaft, has a first end adjacent to the rotating shaft and provided with an accommodating groove. The rotating shaft has a speed reducer with a rotating output portion which can rotate along with the rotating shaft. A rotating speed of the rotating output portion is lower than that of the rotating shaft, and the rotating output portion and the hinge moving plate are rotatably connected to each other. The hinge moving plate includes a second support portion, and the second support portion is at least partially located in the accommodating groove.

18 Claims, 7 Drawing Sheets

(56) References Cited

U.S. PATENT DOCUMENTS

| | | | | |
|---|---|---|---|---|
| 11,589,471 | B2* | 2/2023 | Zhang | G06F 1/1616 |
| 11,681,335 | B1* | 6/2023 | Hsu | G06F 1/1681 |
| | | | | 361/679.01 |
| 11,720,151 | B2* | 8/2023 | Park | G06F 1/1681 |
| | | | | 361/679.27 |
| 11,917,780 | B2* | 2/2024 | Caplow-Munro | H05K 5/0226 |
| 11,997,807 | B2* | 5/2024 | Park | H05K 5/0017 |
| 12,028,470 | B2* | 7/2024 | Wang | H04M 1/0268 |
| 12,032,412 | B2* | 7/2024 | Hu | H04M 1/0268 |
| 12,082,359 | B2* | 9/2024 | Wang | F16C 11/04 |
| 12,173,541 | B2* | 12/2024 | Chung | G06F 1/1681 |
| 12,274,014 | B2* | 4/2025 | Li | F16C 11/04 |
| 2016/0132075 | A1* | 5/2016 | Tazbaz | G06F 1/1616 |
| | | | | 361/679.27 |
| 2018/0059735 | A1* | 3/2018 | Tazbaz | G06F 1/1677 |
| 2018/0066465 | A1* | 3/2018 | Tazbaz | G06F 1/1681 |
| 2018/0164855 | A1* | 6/2018 | Tazbaz | G06F 1/1641 |
| 2018/0356858 | A1* | 12/2018 | Siddiqui | G06F 1/1637 |
| 2020/0012322 | A1 | 1/2020 | Jan et al. | |
| 2020/0352044 | A1 | 11/2020 | Hsu | |
| 2021/0011513 | A1* | 1/2021 | Watamura | G06F 1/1652 |
| 2022/0217228 | A1 | 7/2022 | Hu et al. | |

FOREIGN PATENT DOCUMENTS

| | | |
|---|---|---|
| CN | 211016292 U | 7/2020 |
| CN | 112648279 A | 4/2021 |
| WO | 2013080191 A2 | 6/2013 |

OTHER PUBLICATIONS

First Chinese Office Action related to Application No. 202011618365.2; reported on Aug. 3, 2021.

\* cited by examiner

US 12,429,084 B2

HINGE MECHANISM AND ELECTRONIC DEVICE

CROSS-REFERENCE TO RELATED APPLICATIONS

The present application is a continuation application of PCT International Application No. PCT/CN2021/142366 filed on Dec. 29, 2021, which claims priority to Chinese Patent Application No. 202011618365.2, filed with the China National Intellectual Property Administration on Dec. 30, 2020, and entitled "HINGE MECHANISM AND ELECTRONIC DEVICE", which are incorporated herein by reference in their entireties.

TECHNICAL FIELD

The present application relates to the technical field of foldable electronic devices, and in particular, to a hinge mechanism and an electronic device.

BACKGROUND

With the development of technologies, the development of electronic devices is getting faster and faster, and at the same time, requirements of users on electronic devices are also getting higher and higher. At present, flexible screens are also widely used in electronic devices, thereby forming foldable electronic devices.

Foldable electronic devices often have folding problems in a folding process. For example, when a foldable electronic device is folded inwards, because a bending radius at a hinge is small, a flexible screen is prone to crease or breakage due to excessive pressing. It can be seen that in the current foldable electronic device, the flexible screen is easily damaged in the folding process, which eventually leads to a short service life of the flexible screen.

SUMMARY

According to a first aspect, the present application discloses a hinge mechanism, including a hinge base and rotating support mechanisms respectively connected to two opposite sides of the hinge base; where the two rotating support mechanisms can rotate relative to each other, so that the hinge mechanism is switchable between a first folded state and a second folded state, and the rotating support mechanism includes a rotating shaft, a hinge rotating plate, and a hinge moving plate, where:

the rotating shaft is rotatably arranged on the hinge base, the hinge rotating plate is rotatably connected to the hinge base through the rotating shaft, a first end of the hinge rotating plate adjacent to the rotating shaft is provided with an accommodating groove, and a second end of the hinge rotating plate away from the rotating shaft is a first support portion;

the rotating shaft is provided with a speed reducer, the speed reducer has a rotating output portion, the rotating output portion can rotate along with the rotating shaft, a rotating speed of the rotating output portion is lower than that of the rotating shaft, and the rotating output portion and the hinge moving plate are rotatably connected to each other;

the hinge moving plate includes a second support portion, and the second support portion is at least partially located in the accommodating groove;

when the hinge mechanism is in the first folded state, openings of the accommodating grooves of the two rotating support mechanisms face each other, and the second support portion moves to an avoidance position away from directions of the openings of the accommodating grooves; and when the hinge mechanism is in the second folded state, openings of the accommodating grooves of the two rotating support mechanisms are opposite to each other, and the second support portion moves to a support position towards directions of the openings of the accommodating grooves.

According to a second aspect, the present application discloses an electronic device, including a flexible screen and the above-mentioned hinge mechanism, where the flexible screen is supported on the first support portion and the second support portion.

BRIEF DESCRIPTION OF THE DRAWINGS

The accompanying drawings described herein are intended to provide a further understanding of this application, and constitute a portion of this application. Example embodiments of this application and descriptions thereof are intended to describe this application, and do not constitute limitations on this application. In the accompanying drawings.

DESCRIPTIONS OF REFERENCE NUMERALS

100—hinge base, 110—sleeve, 120—avoidance groove, 130—first cover plate, 140—second cover plate,
200—rotating support mechanism, 210—rotating shaft, 211—first shaft section, 212—second shaft section, 2121—connecting protrusion,
220—hinge rotating plate, 221—accommodating groove, 2211—through hole, 222—first support portion, 223—limiting bone, 220a—first guide accommodating slot, 220b—second guide accommodating slot,
230—hinge moving plate, 231—second support portion, 232—base plate,
240—speed reducer, 241—rotating output portion,
250—pulling rod,
260—first elastic layer,
270—second elastic layer,
280—first connecting rod,
290—second connecting rod,
2100—second gear,
2200—elastic mechanism, 2210—first meshing mechanism, 2220—second meshing mechanism, 2230—elastic piece,
2300—wear-resistant sheet, and
300—flexible screen.

DETAILED DESCRIPTION

To make the objectives, technical solutions, and advantages of this application clearer, the following clearly describes the technical solutions of this application with reference to the specific embodiments of this application and the corresponding accompanying drawings. Apparently, the described embodiments are merely some rather than all of the embodiments of the present application. All other embodiments obtained by persons of ordinary skill in the art based on the embodiments of the disclosure without creative works shall fall within the scope of protection of the disclosure.

The technical solutions disclosed in the various embodiments of the present application will be described in detail below through specific embodiments in conjunction with the accompanying drawings.

As shown in FIG. 1 to FIG. 12, the embodiments of the present application disclose a hinge mechanism. The disclosed hinge mechanism is applied to an electronic device, and the electronic device equipped with the hinge mechanism disclosed in the embodiments of the application is foldable. It should be noted that the electronic device is equipped with a flexible screen 300, the folding of the electronic device can implement folding of the flexible screen 300, and the unfolding of the electronic device can implement unfolding of the flexible screen 300.

The hinge mechanism disclosed in the embodiments of the present application includes a hinge base 100 and two rotating support mechanisms 200.

The hinge base 100 is the basic part of a hinge, and the hinge base 100 can provide the installation foundation for other components of the hinge mechanism.

Figure 1:
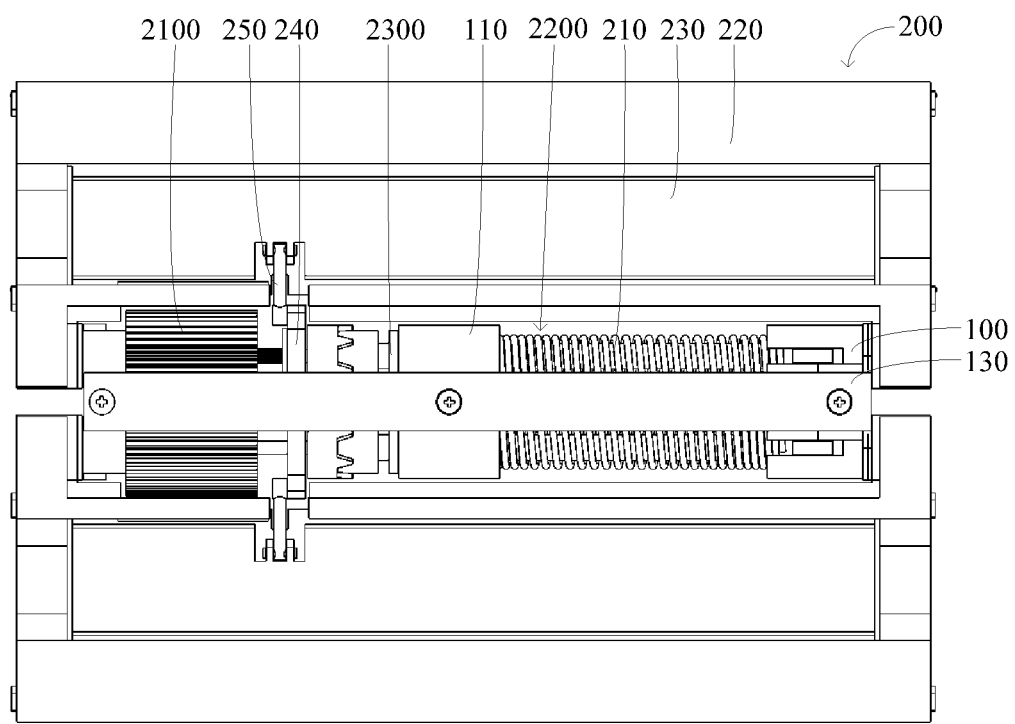
FIG. 1 is a structural schematic diagram of a first hinge mechanism in an unfolded state according to an embodiment of the present application.
Figure 2:
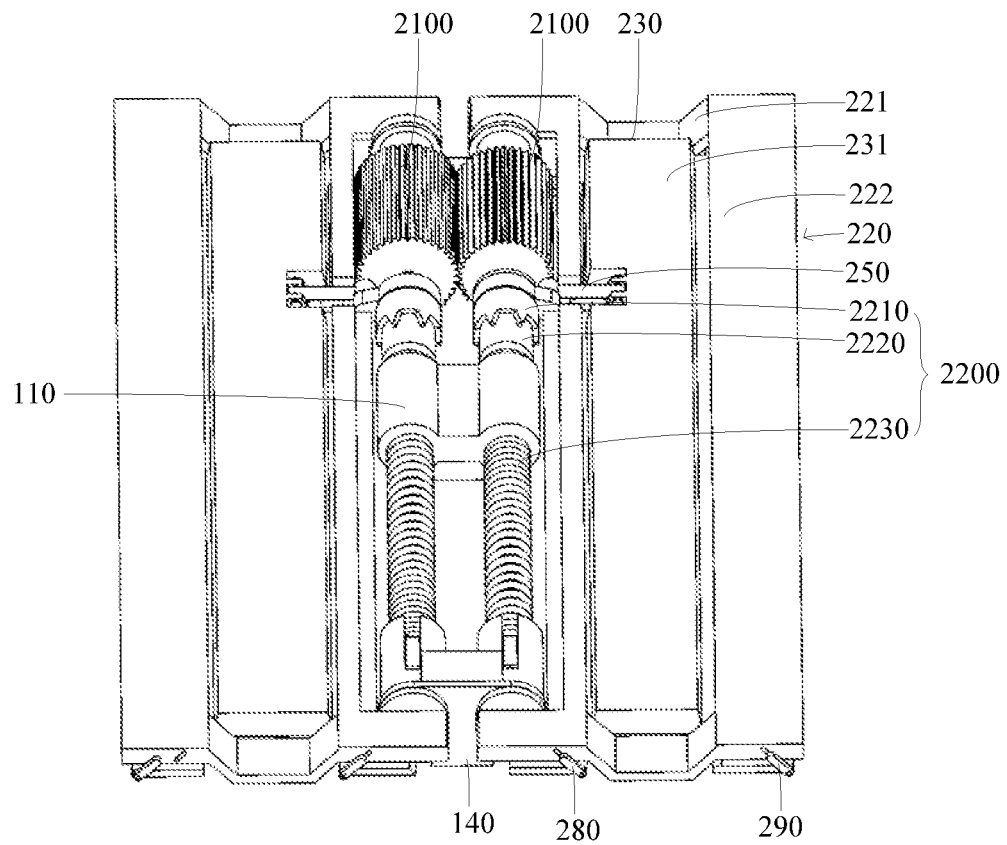
FIG. 2 is a three-dimensional structural schematic diagram of FIG. 1.
Figure 3:
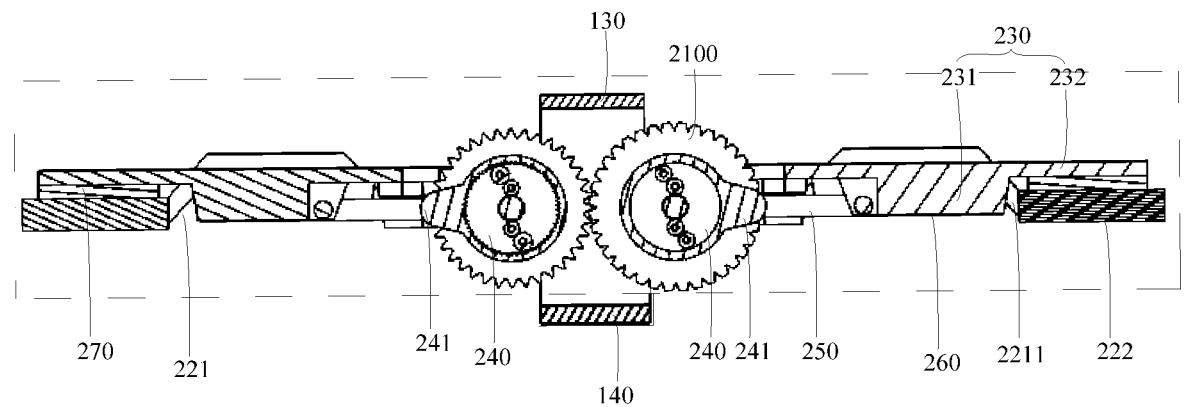
FIG. 3 is a cross-sectional view of a first hinge mechanism in an unfolded state according to an embodiment of the present application.
Figure 4:
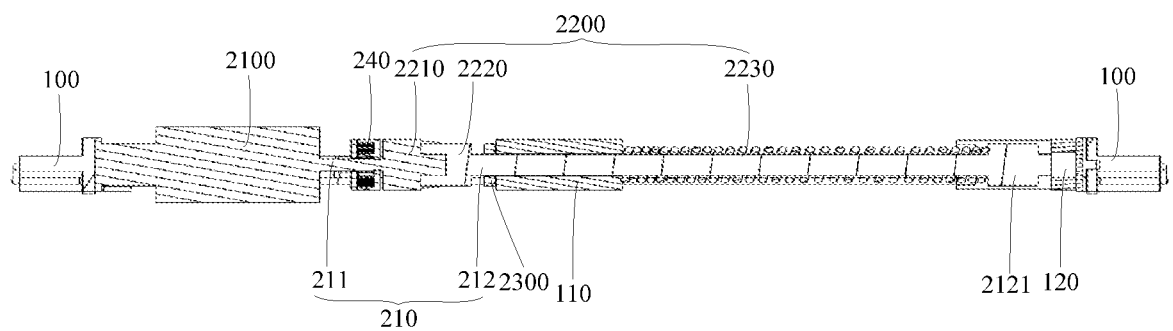
FIG. 4 and FIG. 5 are cross-sectional views of a partial structure of a first hinge mechanism in different states in a rotation process according to an embodiment of the present application.
Figure 5:
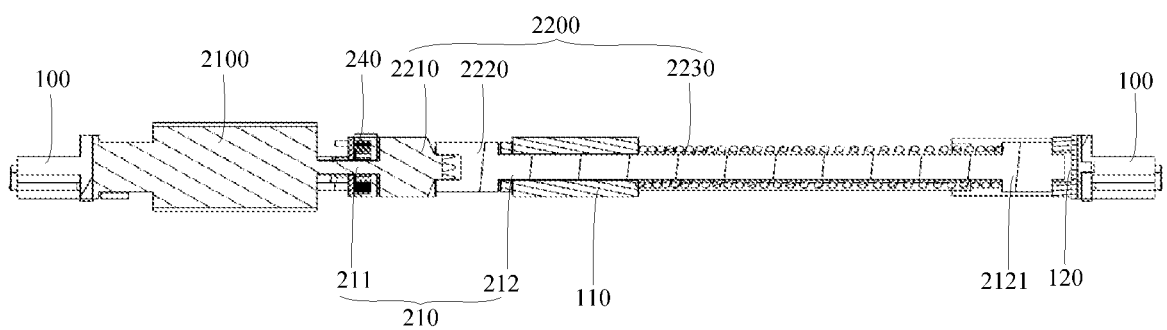
Figure 6:
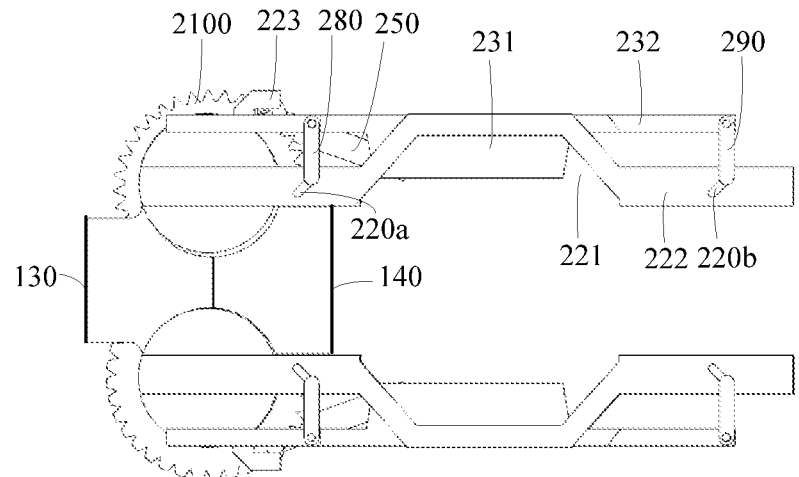
FIG. 6 is a structural schematic diagram of a first hinge mechanism in a first folded state according to an embodiment of the present application.
Figure 7:
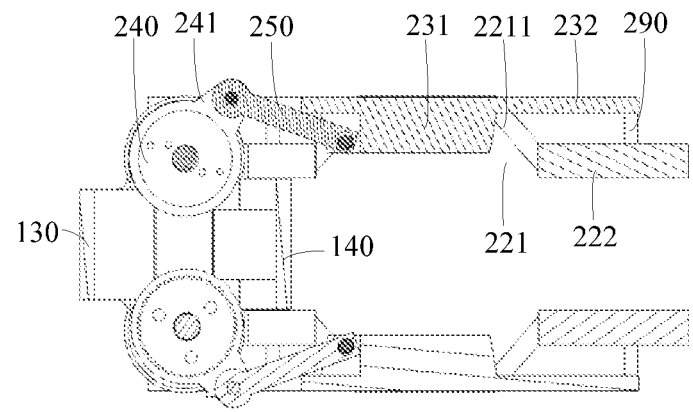
FIG. 7 is a cross-sectional view of a first hinge mechanism in a first folded state according to an embodiment of the present application.
Figure 8:
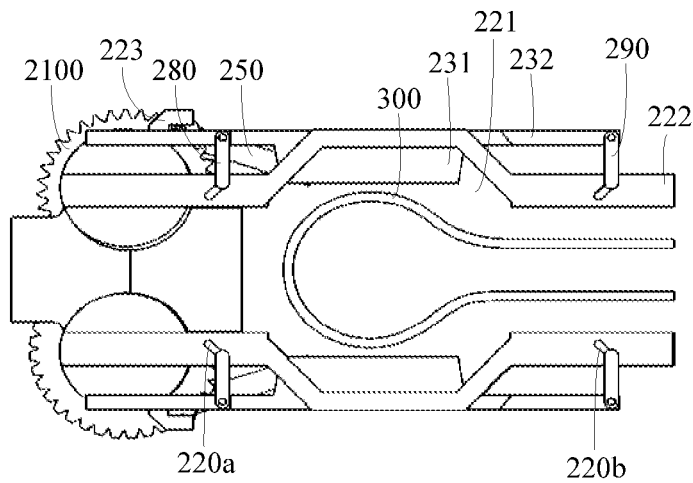
FIG. 8 is a schematic structural diagram of a first electronic device in a first folded state according to an embodiment of the present application.
Figure 9:
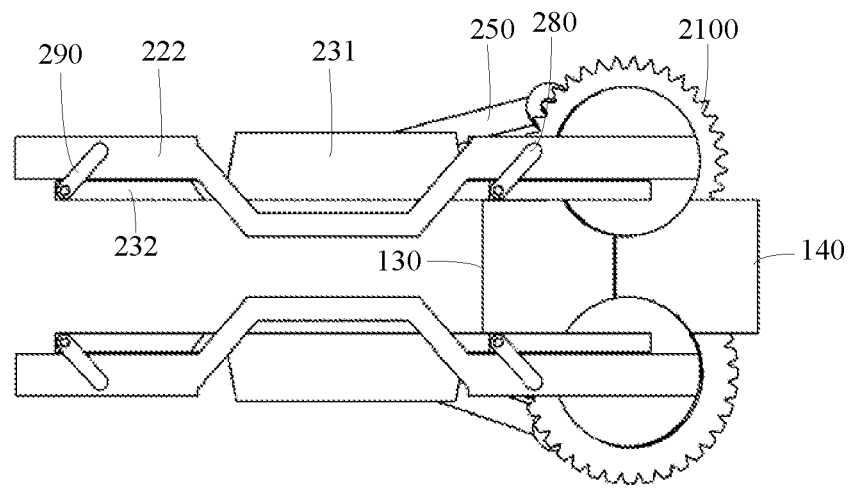
FIG. 9 is a structural schematic diagram of a first hinge mechanism in a second folded state according to an embodiment of the present application.
Figure 10:
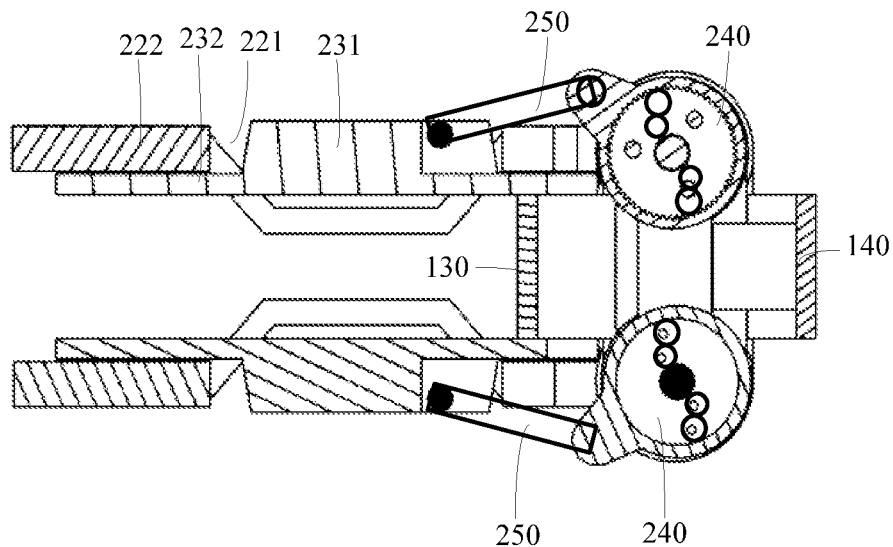
FIG. 10 is a cross-sectional view of a first hinge mechanism in a second folded state according to an embodiment of the present application.

The two rotating support mechanisms 200 can be configured to support the flexible screen 300 of the electronic device. In the embodiments of the present application, the two rotating support mechanisms 200 are respectively connected to two opposite sides of the hinge base 100, and the two rotating support mechanisms 200 can rotate relative to the hinge base 100. The two rotating support mechanisms 200 can rotate relative to each other, so that the hinge mechanism can be switchable between a first folded state and a second folded state. Certainly, the hinge mechanism can be switchable between the first folded state and the second folded state, so that the electronic device can be switchable between the first folded state and the second folded state. Certainly, the hinge mechanism can also be in the unfolded state, so that the electronic device can also be in the unfolded state, as shown in FIG. 3.

In the embodiments of the present application, the rotating support mechanism 200 includes a rotating shaft 210, a hinge rotating plate 220, and a hinge moving plate 230.

The rotating shaft 210 is rotatably provided on the hinge base 100 to rotate relative to the hinge base 100. Specifically, the hinge base 100 may be provided with a mounting hole, and the rotating shaft 210 may be arranged in the mounting hole, so as to achieve rotation mounting through the cooperation of the shaft and the hole. Certainly, the rotating shaft 210 can also be rotatably mounted on the hinge base 100 through bearings. Optionally, the hinge base 100 may be fixed with a sleeve 110, and the rotating shaft 210 may cooperate with the sleeve 110, so as to achieve rotation cooperation with the hinge base 100.

In an optional solution, a wear-resistant sheet 2300 is fixed on a side of the sleeve 110 facing the second meshing mechanism 2220. The wear-resistant sheet 2300 has good wear resistance and can slow down the wear of the sleeve 110.

In a same rotating support mechanism 200, the hinge rotating plate 220 is rotatably connected to the hinge base 100 through the rotating shaft 210, that is, the hinge rotating plate 220 can rotate along with the rotating shaft 210 relative to the hinge base 100. Optionally, the hinge rotating plate 220 is fixedly connected to the rotating shaft 210, and in this case, the rotation of the rotating shaft 210 drives the hinge rotating plate 220 to rotate together. An accommodating groove 221 is provided at a first end of the hinge rotating plate 220 adjacent to the rotating shaft 210, and a second end of the hinge rotating plate 220 away from the rotating shaft 210 is a first support portion 222. That is, a distance between the second end of the hinge rotating plate 220 and the rotating shaft 210 is greater than that between the first end of the hinge rotating plate 220 and the rotating shaft 210. The first support portion 222 can play a supporting role.

The rotating shaft 210 is provided with a speed reducer 240, so that each rotating support mechanism 200 is equipped with a speed reducer 240. The speed reducer 240 has a rotating output portion 241, and the rotating output portion 241 can rotate along with the rotating shaft 210. Under the action of the speed reducer 240, the rotating speed of the rotating output portion 241 is lower than that of the rotation shaft 210.

The hinge moving plate 230 includes a second support portion 231, and the second support portion 231 is at least partially located within the accommodating groove 221. The second support portion 231 can also play a supporting role, and the second support portion 231 can support the flexible screen 300 together with the first support portion 222.

In the embodiments of the present application, the rotating output portion 241 is rotatably connected to the hinge moving plate 230, the rotation of the rotating output portion 241 can drive the hinge moving plate 230 to rotate, and the hinge moving plate 230 is movably fitted with the hinge rotating plate 220, so that the hinge moving plate 230 can move relative to the hinge rotating plate 220.

As mentioned above, during the rotation of the rotating shaft 210, due to the existence of the speed reducer 240, the rotating speed of the rotating shaft 210 is greater than that of the rotating output portion 241, so that the rotating speed of the hinge rotating plate 220 is greater than that of the hinge moving plate 230. In this case, the hinge moving plate 230 can move relative to the hinge rotating plate 220, so that the position of the second support portion 231 in the accommodating groove 221 can be changed.

As mentioned above, the hinge mechanism has the first folded state and the second folded state.

When the hinge mechanism is in the first folded state, openings of the accommodating grooves 221 of the two rotating support mechanisms 200 face each other, and the second support portion 231 moves to an avoidance position relative to the hinge rotating plate 220 away from directions of the openings of the accommodating grooves. In this case, a part of space adjacent to the openings of the accommodating grooves 221 of the two rotating support mechanisms 200 can be released, thereby forming a larger accommodating space to accommodate the bending redundant area of the flexible screen 300. This avoids that when the electronic device is folded inwards, because a bending radius is small, a flexible screen 300 is prone to crease or breakage due to excessive pressing.

When the hinge mechanism is in the second folded state, the openings of the accommodating grooves 221 of the two rotating support mechanisms 200 are opposite to each other, and the second support portion 231 moves to a support position relative to the hinge rotating plate 220 towards directions of the openings of the accommodating grooves 221. In this case, the second support portion 231 cooperates with the first support portion 222, so as to implement better supporting for the flexible screen 300.

The hinge mechanism disclosed in the embodiments of the present application improves the related technology, so that the hinge mechanism includes two rotating support mechanisms 200 respectively connected to the two opposite sides of the hinge base, and each rotating support mechanism 200 can rotate relative to the hinge base 100, so that the hinge mechanism is switchable between a first folded state and a second folded state. When the hinge mechanism is in the first folded state, since the speed reducer 240 can make the hinge moving plate 230 move to the avoidance position away from the direction of the opening of the accommodating groove 221 in the process of rotating and folding, the openings of the accommodating grooves 221 of the two rotating support mechanisms 200 face each other, and a larger accommodating space is formed to accommodate a bending area of the flexible screen 300. This undoubtedly can avoid a problem of breaking the flexible screen 300 caused by an excessively small bending radius during the folding process.

At the same time, when the hinge mechanism is in the second folded state, the openings of the accommodating grooves 221 of the two rotating support mechanisms 200 are opposite to each other, and the second support portion 231 moves to a support position relative to the hinge rotating plate 220 towards directions of the openings of the accommodating grooves 221. In this case, the second support portion 231 can support the area of the flexible screen 300 facing the opening of the accommodating groove 221, thereby better supporting the flexible screen 300.

The hinge mechanism disclosed in the embodiments of the present application can implement bidirectional folding, that is, folding in a first direction enables to switch to the first folded state, and folding in a second direction enables to switch to the second folded state. The first direction is opposite to the second direction. The electronic device adopting the hinge mechanism disclosed in the embodiments of the present application can implement bidirectional folding, thereby increasing usage scenarios of the electronic device.

As mentioned above, the rotating output portion 241 also rotates during the rotation of the rotating shaft 210, but the rotating output portion 241 rotates at a lower speed. Therefore, the rotating speed of the hinge moving plate 230 is lower than that of the hinge rotating plate 220. Based on this, in an optional solution, the rotating output portion 241 can be rotatably connected to the hinge moving plate 230 through a pulling rod 250, a first end of the pulling rod 250 is connected to the rotating output portion 241, and a second end of the pulling rod 250 is rotatably connected to the hinge moving plate 230. This structure can make the hinge moving plate 230 more flexible, and better facilitates being away from the opening of the accommodating groove 221 or being close to the opening of the accommodating groove 221.

Figure 11:
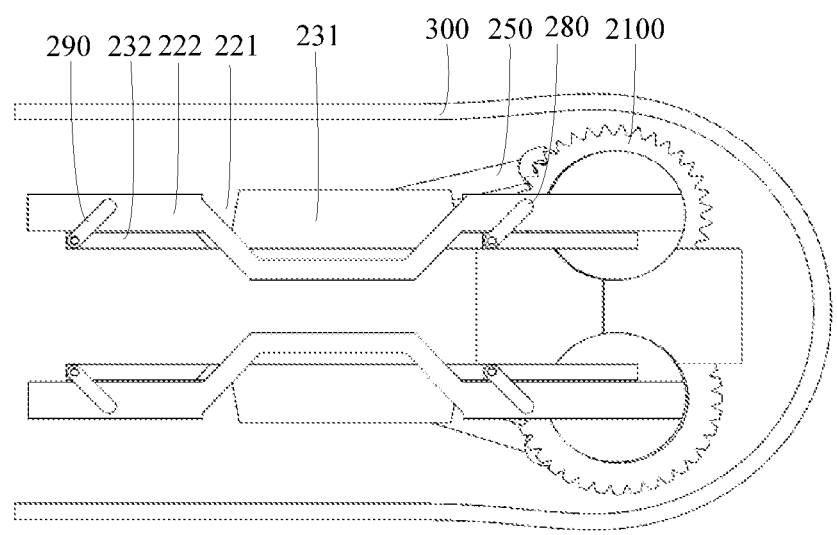
FIG. 11 is a schematic structural diagram of a first electronic device in a second folded state according to an embodiment of the present application.

In the hinge mechanism disclosed in the embodiments of the present application, the hinge mechanism can be switched between the first folded state and the second folded state through manual manipulation. In an optional solution, both the rotating shafts 210 of the two rotating support mechanisms 200 may be optical axes, that is, there may be no power transmission between the rotating shafts 210 of the two rotating support mechanisms 200. In a manipulation process, the operator can drive the two rotating support mechanisms 200 to rotate, so that the rotating shafts 210 of the two rotating support mechanisms 200 rotate relative to the hinge base 100. In this structure, the operator can control one of the rotating support mechanisms 200 to rotate in one direction relative to the hinge base 100, and can also control the other rotating support mechanism 200 to rotate in another opposite direction relative to the hinge base 100, so that the hinge mechanism can be in the first folded state or the second folded state, as shown in FIG. 11.

Figure 12:
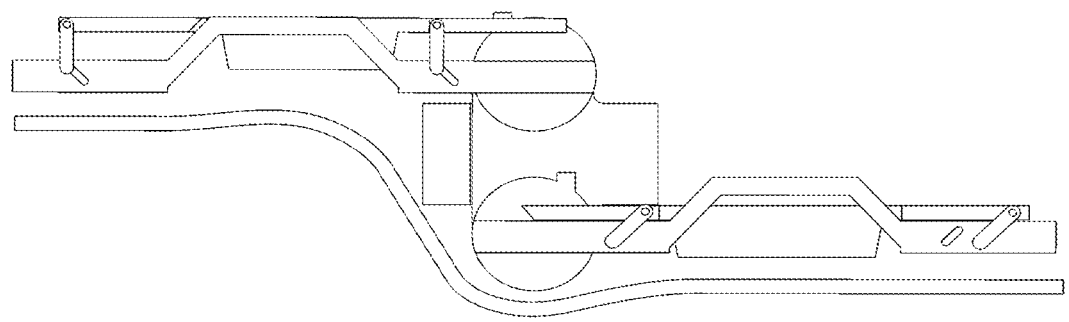
FIG. 12 is a schematic structural diagram of a second electronic device in an unfolded state according to an embodiment of the present application.

Certainly, the operator can control the two rotating support mechanisms 200 to rotate in a same direction, so that the hinge mechanism forms another state, as shown in FIG. 12, to further meet more requirements on the folded state of the electronic device.

In another optional solution, the rotating shafts 210 of the two rotating support mechanisms 200 are both provided with a second gear 2100, and the second gear 2100 of one rotating support mechanism 200 meshes with the second gear 2100 of the other rotating support mechanism 200. In this case, the two rotating support mechanisms 200 mesh with each other to implement synchronous and reverse rotation, which can ensure better synchronization of the two rotating support mechanisms 200.

In a further technical solution, the two rotating support mechanisms 200 may include an elastic mechanism 2200, and the elastic mechanism 2200 may include a first meshing mechanism 2210, a second meshing mechanism 2220, and an elastic piece 2230.

The rotating shaft 210 includes a first shaft section 211 and a second shaft section 212, the first meshing mechanism 2210 is fixed on an end of the first shaft section 211 facing the second shaft section 212, the speed reducer 240 is arranged on the first shaft section 211, the second meshing mechanism 2220 is fixed on an end of the second shaft section 212 facing the first shaft section 211, the second shaft section 212 is movably arranged on the hinge base 100 along an axial direction of the second shaft section 212, the first meshing mechanism 2210 and the second meshing mechanism 2220 mesh with each other and can rotate relative to each other, the elastic piece 2230 is elastically positioned between the hinge base 100 and the second meshing mechanism 2220, and the elastic piece 2230 can drive the first meshing mechanism 2220 to be elastically attached to the first meshing mechanism 2210. In this case, a meshing force between the first meshing mechanism 2210 and the second meshing mechanism 2220 can only be overcome when the user applies a relatively large external force, so as to implement relative rotation and then implement the relative rotation between the rotating support mechanisms 200. When the user removes the external force, the meshing force between the first meshing mechanism 2210 and the second meshing mechanism 2220 can make the two rotating support mechanisms 200 maintain in the current unfolded state through the meshing between the two second gears 2100, so that the hinge mechanism has multiple unfolding angles.

In an optional solution, the hinge base 100 may be fixed to a sleeve 110, and the second shaft section 212 passes through the sleeve 110 and is slidably fitted with the sleeve 110, so that the second shaft section 212 is movably arranged on the hinge base 100 along an axial direction of the second shaft section 212. At the same time, the sleeve 110 can be rotatably connected to the second shaft section 212 through cooperation and the shaft and the hole.

In this embodiment of the application, a first end of the second shaft section 212 is provided with a connecting protrusion 2121, a second end of the second shaft section 212 is provided with the second meshing mechanism 2220, the sleeve 110 is located between the two ends of the second shaft section 212; one end of the elastic piece 2230 is fixedly connected to the sleeve 110, the other end of the elastic piece 2230 is fixedly connected to the connecting protrusion 2121, and the elastic piece 2230 can drive the connecting protrusion 2121 to move towards a direction close to the first shaft section 211.

In the embodiments of the present application, the hinge base 100 may be provided with an avoidance groove 120, and the first end of the second shaft section 212 is arranged opposite to the avoidance groove 120 and can be slidably fitted with the avoidance groove 120, so as to slide relative to the avoidance groove 120. Along with movement of the second shaft section 212, the connecting protrusion 2121 can contact, in a limiting manner, with a surface where an opening of the avoidance groove 120 is located. In this case, the connecting protrusion 2121 can cooperate with the avoidance groove 120 to improve assembly performance. At the same time, the surface where the opening of the avoidance groove 120 is located can limit the movement of the second shaft section 212, to avoid that the second shaft section 212 moves excessively.

In the embodiments of the present application, a support surface of the second support portion 231 may be provided with a first elastic layer 260, and the first elastic layer 260 may be a foam layer. When the hinge mechanism is in the second folded state, the second support portion 231 is in a support position, and the first elastic layer 260 can better support the flexible screen 300. At the same time, the first elastic layer 260 can better compensate for a height difference with the first support portion 222 through its own elastic deformation, so as to achieve a better cooperative supporting effect.

In an optional solution, a second elastic layer 270 may be disposed between a region of the base plate 232 extending to the back side of the first support portion 222 and the first support portion 222. In this structure, when the hinge mechanism is in the second folded state, the first support portion 222 can form elastic fitting with the base plate 232 through the second elastic layer 270, thereby improving structural stability of the hinge mechanism in the second folded state.

During the folding process of the hinge mechanism, the second support portion 231 moves in the accommodating groove 221. In a further technical solution, an inner wall of the accommodating groove 221 may be provided with a through hole 2211, and at least a part of the second support portion 231 may enter and leave the accommodating groove 221 through the through hole 2211. In this case, the second support portion 231 is not interfered by the inner wall of the accommodating groove 221, and therefore can move more flexibly in a direction away from the opening of the accommodating groove 221.

In the hinge mechanism disclosed in the embodiments of the present application, the hinge moving plate 230 may include a base plate 232, and the second support portion 231 is arranged on the base plate 232. The base plate 232 passes through the through hole 2211, and the base plate 232 extends to the back side of the first support portion 222, that is, extends to a side away from the support surface of the first support portion 222. In this case, when the hinge mechanism is folded to the second folded state, the base plate 232 gradually approaches the side of the first support portion 222. When the hinge mechanism is in the second folded state, the base plate 232 contacts with the second support portion 231 in a limiting manner, thereby constraining the hinge rotating plate 220 and the hinge moving plate 230, and making it easier for the first support portion 222 to cooperate with the second support portion 231 to jointly support the flexible screen 300.

In the embodiments of the present application, the first end of the hinge moving plate 230 may be opposite to the first end of the hinge rotating plate 220, and the first connecting rod 280 may be rotatably connected between the first end of the hinge moving plate 230 and the first end of the hinge rotating plate 220, that is, one end of the first connecting rod 280 is rotatably connected to the first end of the hinge moving plate 230, and the other end of the first connecting rod 280 is rotatably connected to the hinge rotating plate 220.

The second end of the hinge moving plate 230 is opposite to the second end of the hinge rotating plate 220, and the second connecting rod 290 may be rotatably connected between the second end of the hinge moving plate 230 and the second end of the hinge rotating plate 220, that is, one end of the second connecting rod 290 is rotatably connected to the second end of the hinge moving plate 230, and the other end of the second connecting rod 290 is rotatably connected to the second end of the hinge rotating plate 220. In this case, the hinge moving plate 230 and the hinge rotating plate 220 are connected through the first connecting rod 280 and the second connecting rod 290, and the hinge moving plate 230 can translate relative to the hinge rotating plate 220 through the first connecting rod 280 and the second connecting rod 290. During the rotation of the hinge mechanism, the hinge moving plate 230 has a higher degree of freedom, thereby facilitating movement of the hinge moving plate 230 relative to the hinge rotating plate 220. At the same time, the first connecting rod 280 and the second connecting rod 290 can enable the hinge moving plate 230 to achieve translation, and no interference is generated in the direction of rotation to affect the rotation. At the same time, this also enables the hinge mechanism to achieve a more regular folding in the first folding state and the second folding state.

In an optional solution, the hinge rotating plate 220 is provided with a first guide accommodating slot 220*a* and a second guide accommodating slot 220*b*, an end of the first connecting rod 280 is rotatably connected to the first guide accommodating slot 220*a* and is capable of sliding relative to the first guide accommodation groove 220a; an end of the second connecting rod 290 is rotatably connected to the second guide accommodation groove 220b and is capable of sliding relative to the second guide accommodation groove 220b, and when the hinge mechanism is in the second folded state, a part of the first connecting rod 280 extends into the first guide accommodating slot 220a, and a part of the second connecting rod 290 extends into the second guide accommodating slot 220b. In this case, a part of the first connecting rod 280 is accommodated in the first guide accommodating slot 220a, and a part of the second connecting rod 290 is accommodated in the second guide accommodating slot 220b, so that the hinge mechanism can be folded more compactly in the second folded state, and the hinge rotating plate 220 and the hinge moving plate 230 can better approach each other.

In the embodiments of the present application, the first end of the hinge rotating plate 220 is provided with a limiting bone 223, and when the hinge mechanism is in the first folded state, the limiting bone 223 and the hinge moving plate 230 are fitted in a limiting manner. In this case, the second support portion 231 of the hinge moving plate 230 can stop moving further away from the opening of the accommodating groove 221, preventing the second support portion 231 from being excessively far away.

In the embodiments of the present application, the structure of the hinge base 100 can be various. In an optional solution, the hinge base 100 can include a first cover plate 130 and a second cover plate 140, and the first cover plate 130 and the second cover plate 140 are both arranged between the two rotating support mechanisms 200. The first cover plate 130 and the second cover plate 140 are arranged opposite to each other. When the hinge mechanism is in the first folded state, the hinge rotating plates 220 of the two rotating support mechanisms 200 are fitted with the first cover plate 130 in a limiting manner, thereby preventing the two rotating support mechanisms 200 from excessively rotating. In a specific manipulation process, when the hinge rotating plates 220 of the two rotating support mechanisms 200 are limited by the first cover plate 130 and cannot further rotate, it means that the hinge mechanism is already in the first folded state.

When the hinge mechanism is in the second folded state, the hinge moving plates 230 of the two rotating support mechanisms 200 are fitted with the second cover plate 140 in a limiting manner. In a specific manipulation process, when the hinge rotating plates 220 of the two rotating support mechanisms 200 are fitted with the second cover plate 140 in a limiting manner and cannot further rotate, it means that the hinge mechanism is already in the second folded state. Moreover, the fitting in a limiting manner can avoid excessive rotation of the two rotating support mechanisms 200.

Based on the hinge mechanism disclosed in the embodiments of the present application, the embodiments of the present application disclose an electronic device, and the disclosed electronic device includes a flexible screen 300 and the hinge mechanism described in the above embodiments. The flexible screen 300 is supported on the first support portion 222 and the second support portion 231.

The electronic device disclosed in the embodiments of the present application may be a mobile phone, a tablet computer, an e-book reader, a game console, or the like, and the embodiment of the present application does not limit the specific type of the electronic device.

The embodiments of the present application focus on describing differences between the embodiments, and different optimization features of the embodiments may be combined to form better embodiments provided that they are not contradictory. Considering brevity, details are not described herein again.

The above descriptions are only examples of the present application, and are not intended to limit the present application. For a person of ordinary skill in the art, the present application may have various changes and variations. Any modification, equivalent replacement, improvement, or the like made without departing from the spirit and principle of the present application shall fall within the scope of claims of the present application.

What is claimed is:

1. A hinge mechanism, comprising a hinge base and rotating support mechanisms respectively connected to two opposite sides of the hinge base; wherein the two rotating support mechanisms can rotate relative to each other, so that the hinge mechanism is switchable between a first folded state and a second folded state, and the two rotating support mechanism comprises a rotating shaft, a hinge rotating plate, and a hinge moving plate, wherein: the rotating shaft is rotatably arranged on the hinge base, the hinge rotating plate is rotatably connected to the hinge base through the rotating shaft, a first end of the hinge rotating plate adjacent to the rotating shaft is provided with an accommodating groove, and a second end of the hinge rotating plate away from the rotating shaft is a first support portion; the rotating shaft is provided with a speed reducer, the speed reducer has a rotating output portion, the rotating output portion can rotate along with the rotating shaft, a rotating speed of the rotating output portion is lower than that of the rotating shaft, and the rotating output portion and the hinge moving plate are rotatably connected to each other; the hinge moving plate comprises a second support portion, and the second support portion is at least partially located in the accommodating groove; when the hinge mechanism is in the first folded state, openings of the accommodating grooves of the two rotating support mechanisms face each other, and the second support portion moves to an avoidance position away from directions of the openings of the accommodating grooves; and when the hinge mechanism is in the second folded state, openings of the accommodating grooves of the two rotating support mechanisms are opposite to each other, and the second support portion moves to a support position towards directions of the openings of the accommodating grooves;

wherein the rotating output portion is rotatably connected to the hinge moving plate through a pulling rod, a first end of the pulling rod is rotatably connected to the rotating output portion, and a second end of the pulling rod is rotatably connected to the hinge moving plate.

2. The hinge mechanism according to claim 1, wherein the rotating shafts of the two rotating support mechanisms are provided with second gears, and the second gear of one rotating support mechanism meshes with the second gear of the other rotating support mechanism.

3. The hinge mechanism according to claim 2, wherein each of the two rotating support mechanisms comprises an elastic mechanism, and the elastic mechanism comprises a first meshing mechanism, a second meshing mechanism, and an elastic piece, wherein:

the rotating shaft comprises a first shaft section and a second shaft section, the first meshing mechanism is fixed on an end of the first shaft section facing the second shaft section, the speed reducer is arranged on the first shaft section, the second meshing mechanism is fixed on an end of the second shaft section facing the first shaft section, the second shaft section is movably arranged on the hinge base along an axial direction of the second shaft section, the first meshing mechanism and the second meshing mechanism mesh with each other and can rotate relative to each other, the elastic piece is elastically positioned between the hinge base and the second meshing mechanism, and the elastic piece can drive the first meshing mechanism to be elastically attached to the first meshing mechanism.

4. The hinge mechanism according to claim 3, wherein the hinge base is provided with a sleeve, and the second shaft section passes through the sleeve and is slidably fitted with the sleeve.

5. The hinge mechanism according to claim 4, wherein a first end of the second shaft section is provided with a connecting protrusion, a second end of the second shaft section is provided with the second meshing mechanism, the sleeve is located between the two ends of the second shaft section; one end of the elastic piece is fixedly connected to the sleeve, the other end of the elastic piece is fixedly connected to the connecting protrusion, and the elastic piece can drive the connecting protrusion to move towards a direction close to the first shaft section.

6. The hinge mechanism according to claim 5, wherein the hinge base is provided with an avoidance groove, the first end of the second shaft section is arranged opposite to the avoidance groove and can be slidably fitted with the avoidance groove, and along with movement of the second shaft section, the connecting protrusion can contact, in a limiting manner, with a surface where an opening of the avoidance groove is located.

7. The hinge mechanism according to claim 1, wherein an inner wall of the accommodating groove is provided with a through hole, and at least a part of the hinge moving plate can enter and leave the accommodating groove through the through hole.

8. The hinge mechanism according to claim 7, wherein the hinge moving plate comprises a base plate, the second support portion is arranged on the base plate, and the base plate passes through the through hole and extends to a back side of the first support portion.

9. The hinge mechanism according to claim 8, wherein a second elastic layer is disposed between a region of the base plate extending to the back side of the first support portion and the first support portion.

10. The hinge mechanism according to claim 1, wherein the first end of the hinge moving plate is opposite to the first end of the hinge rotating plate, a first connecting rod is rotatably connected between the first end of the hinge moving plate and the first end of the hinge rotating plate, the second end of the hinge moving plate is opposite to the second end of the hinge rotating plate, a second connecting rod is rotatably connected between the second end of the hinge moving plate and the second end of the hinge rotating plate, and the hinge moving plate can translate relative to the hinge rotating plate through the first connecting rod and the second connecting rod.

11. The hinge mechanism according to claim 10, wherein the hinge rotating plate is provided with a first guide accommodating slot and a second guide accommodating slot, an end of the first connecting rod is rotatably connected to the first guide accommodating slot and is capable of sliding relative to the first guide accommodation groove; an end of the second connecting rod is rotatably connected to the second guide accommodation groove and is capable of sliding relative to the second guide accommodation groove, and when the hinge mechanism is in the second folded state, a part of the first connecting rod extends into the first guide accommodating slot, and a part of the second connecting rod extends into the second guide accommodating slot.

12. The hinge mechanism according to claim 1, wherein the first end of the hinge rotating plate is provided with a limiting bone, and when the hinge mechanism is in the first folded state, the limiting bone and the hinge moving plate are fitted in a limiting manner.

13. The hinge mechanism according to claim 1, wherein the hinge base comprises a first cover plate and a second cover plate, the first cover plate and the second cover plate are both provided between the two rotating support mechanisms, the first cover plate and the second cover plate are arranged opposite to each other, when the hinge mechanism is in the first folded state, the hinge rotating plates of the two rotating support mechanisms are fitted with the first cover plate in a limiting manner; and when the hinge mechanism is in the second folded state, the hinge moving plates of the two rotating support mechanisms are fitted with the second cover plate in a limiting manner.

14. An electronic device, comprising a flexible screen and a hinge mechanism; wherein the hinge mechanism comprises a hinge base and rotating support mechanisms respectively connected to two opposite sides of the hinge base; wherein the two rotating support mechanisms can rotate relative to each other, so that the hinge mechanism is switchable between a first folded state and a second folded state, and the two rotating support mechanism comprises a rotating shaft, a hinge rotating plate, and a hinge moving plate, wherein: the rotating shaft is rotatably arranged on the hinge base, the hinge rotating plate is rotatably connected to the hinge base through the rotating shaft, a first end of the hinge rotating plate adjacent to the rotating shaft is provided with an accommodating groove, and a second end of the hinge rotating plate away from the rotating shaft is a first support portion; the rotating shaft is provided with a speed reducer, the speed reducer has a rotating output portion, the rotating output portion can rotate along with the rotating shaft, a rotating speed of the rotating output portion is lower than that of the rotating shaft, and the rotating output portion and the hinge moving plate are rotatably connected to each other; the hinge moving plate comprises a second support portion, and the second support portion is at least partially located in the accommodating groove; when the hinge mechanism is in the first folded state, openings of the accommodating grooves of the two rotating support mechanisms face each other, and the second support portion moves to an avoidance position away from directions of the openings of the accommodating grooves; and when the hinge mechanism is in the second folded state, openings of the accommodating grooves of the two rotating support mechanisms are opposite to each other, and the second support portion moves to a support position towards directions of the openings of the accommodating grooves; wherein the flexible screen is supported on the first support portion and the second support portion;

wherein the rotating output portion is rotatably connected to the hinge moving plate through a pulling rod, a first end of the pulling rod is rotatably connected to the rotating output portion, and a second end of the pulling rod is rotatably connected to the hinge moving plate.

15. The electronic device according to claim 14, wherein the rotating shafts of the two rotating support mechanisms are provided with second gears, and the second gear of one rotating support mechanism meshes with the second gear of the other rotating support mechanism.

16. The electronic device according to claim 15, wherein each of the two rotating support mechanisms comprises an elastic mechanism, and the elastic mechanism comprises a first meshing mechanism, a second meshing mechanism, and an elastic piece, wherein:

the rotating shaft comprises a first shaft section and a second shaft section, the first meshing mechanism is fixed on an end of the first shaft section facing the second shaft section, the speed reducer is arranged on the first shaft section, the second meshing mechanism is fixed on an end of the second shaft section facing the first shaft section, the second shaft section is movably arranged on the hinge base along an axial direction of the second shaft section, the first meshing mechanism and the second meshing mechanism mesh with each other and can rotate relative to each other, the elastic piece is elastically positioned between the hinge base and the second meshing mechanism, and the elastic piece can drive the first meshing mechanism to be elastically attached to the first meshing mechanism.

17. The electronic device according to claim 16, wherein the hinge base is provided with a sleeve, and the second shaft section passes through the sleeve and is slidably fitted with the sleeve.

18. The electronic device according to claim 17, wherein a first end of the second shaft section is provided with a connecting protrusion, a second end of the second shaft section is provided with the second meshing mechanism, the sleeve is located between the two ends of the second shaft section; one end of the elastic piece is fixedly connected to the sleeve, the other end of the elastic piece is fixedly connected to the connecting protrusion, and the elastic piece can drive the connecting protrusion to move towards a direction close to the first shaft section.

\* \* \* \* \*